United States Patent
Bao et al.

(10) Patent No.: US 10,468,412 B2
(45) Date of Patent: Nov. 5, 2019

(54) FORMATION OF A SEMICONDUCTOR DEVICE WITH SELECTIVE NITRIDE GROWN ON CONDUCTOR

(71) Applicant: International Business Machines Corporation, Armonk, NY (US)

(72) Inventors: Ruqiang Bao, Niskayuna, NY (US); Dechao Guo, Niskayuna, NY (US); Zuoguang Liu, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 10 days.

(21) Appl. No.: 15/194,915

(22) Filed: Jun. 28, 2016

(65) Prior Publication Data

US 2017/0373063 A1 Dec. 28, 2017

(51) Int. Cl.
| | | |
|---|---|---|
| *H01L 29/66* | (2006.01) | |
| *H01L 29/78* | (2006.01) | |
| *H01L 27/092* | (2006.01) | |
| *H01L 21/8238* | (2006.01) | |

(52) U.S. Cl.
CPC .. *H01L 27/0924* (2013.01); *H01L 21/823814* (2013.01); *H01L 21/823821* (2013.01); *H01L 21/823864* (2013.01); *H01L 29/66795* (2013.01); *H01L 29/785* (2013.01)

(58) Field of Classification Search
CPC .............. H01L 21/3211; H01L 27/0924; H01L 21/823814; H01L 21/823821; H01L 21/823864; H01L 29/66795–29/785

USPC .......................................................... 257/369
See application file for complete search history.

(56) References Cited

U.S. PATENT DOCUMENTS

| | | | |
|---|---|---|---|
| 6,770,516 B2 | 8/2004 | Wu et al. | |
| 7,172,792 B2 | 2/2007 | Wang et al. | |
| 7,476,578 B1 | 1/2009 | Cheng et al. | |
| 8,404,592 B2 | 3/2013 | Luning et al. | |
| 8,525,234 B2 | 9/2013 | Bonser et al. | |
| 9,023,700 B2 | 5/2015 | Ganguly et al. | |
| 9,087,921 B2 | 7/2015 | Cheng et al. | |
| 9,171,927 B2 | 10/2015 | Mehta et al. | |
| 2007/0020866 A1* | 1/2007 | Cheng ............. | H01L 21/823814 438/301 |

(Continued)

OTHER PUBLICATIONS

Liu et al., "FDSOI CMOS devices featuring dual strained channel and thin BOX extendable to the 10nm node," International Electron Devices Meeting (IEDM), paper 9.1, 2014, 4 pages.

(Continued)

*Primary Examiner* — Mohsen Ahmadi
*Assistant Examiner* — Patricia D Reddington
(74) *Attorney, Agent, or Firm* — Cantor Colburn LLP; Vazken Alexanian

(57) ABSTRACT

A method of forming a fin-type field effect transistor (Fin-FET) according to one or more embodiments comprise etching a gate spacer of a complementary pair of transistors. An oxide is deposited over the source and drain of the transistors. A block mask is placed over the first transistor, and the oxide is removed from the second transistor. The block mask is removed and an epitaxial growth is performed on the second transistor. A selective nitridation is performed on the second transistor, and the process is repeated for the first transistor. Other embodiments are also described.

20 Claims, 21 Drawing Sheets

(56) References Cited

U.S. PATENT DOCUMENTS

| | | | |
|---|---|---|---|
| 2008/0305647 A1* | 12/2008 | Matsushita | C23C 8/02 438/791 |
| 2011/0049630 A1* | 3/2011 | Majumdar | H01L 21/823807 257/351 |
| 2012/0077319 A1* | 3/2012 | Lee | H01L 21/823425 438/229 |
| 2015/0115371 A1 | 4/2015 | Ganz et al. | |
| 2015/0236117 A1* | 8/2015 | Kapoor | H01L 29/6659 257/336 |

OTHER PUBLICATIONS

Yokoyama et al., "Atomic-layer selective deposition of silicon nitride on hydrogen-terminated Si surfaces," Applied Surface Science, vol. 130, 1998, pp. 352-356.

* cited by examiner

FORMATION OF A SEMICONDUCTOR DEVICE WITH SELECTIVE NITRIDE GROWN ON CONDUCTOR

BACKGROUND

The present invention relates in general to semiconductor device structures and their fabrication. More specifically, the present invention relates to the fabrication of a fin-type field effect transistor (FinFET) with equal spacers for n-type and p-type transistors.

Typical semiconductor devices are formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. A complementary metal-oxide-semiconductor uses both n-type FETs and p-type FETs in the same device.

One particularly advantageous type of MOSFET is known generally as a fin-type field effect transistor (FinFET). A three-dimensional view of an exemplary FinFET 100 is shown in FIG. 1. The basic electrical layout and mode of operation of FinFET 100 do not differ significantly from a traditional field effect transistor. FinFET 100 includes a semiconductor substrate 102, a shallow trench isolation (STI) layer 104, a fin 106 and a gate 114, configured and arranged as shown. Fin 106 includes a source region 108, a drain region 110 and a channel region 112, wherein gate 114 extends over the top and sides of channel region 112. For ease of illustration, a single fin is shown in FIG. 1. In practice, FinFET devices are fabricated having multiple fins formed on STI 104 and substrate 102. Substrate 102 may be silicon, and STI 104 may be an oxide (e.g., $SiO_2$). Fin 106 may be silicon that has been enriched to a desired concentration level of germanium. Gate 114 controls the source to drain current flow (labeled ELECTRICITY FLOW in FIG. 1). In contrast to a planar MOSFET, however, source 108, drain 110 and channel 112 are built as a three-dimensional bar on top of STI layer 104 and semiconductor substrate 102. The three-dimensional bar is the aforementioned "fin 106," which serves as the body of the device. The gate electrode is then wrapped over the top and sides of the fin, and the portion of the fin that is under the gate electrode functions as the channel. The source and drain regions are the portions of the fin on either side of the channel that are not under the gate electrode. The dimensions of the fin establish the effective channel length for the transistor.

Typically, during the manufacture of a semiconductor, a POC liner is used to protect the source and drain epitaxial growth. Typically, the POC liner has been silicon nitride. A more efficient method of constructing a semiconductor, using selective nitride growth on conductor materials, is presented herein.

SUMMARY

Described herein is a method of forming a fin-type field effect transistor (FinFET), wherein the method includes providing an assembly of a complementary pair of transistors in a fin configuration comprising a first transistor and a second transistor. The method further includes performing an etch of a spacer over a gate region of both the first transistor and the second transistor. An oxide is deposited over a source region and a drain region of both the first transistor and the second transistor. A block mask is placed over the first transistor. The oxide is removed from the source region and drain region of the second transistor. An epitaxial growth is performed on the source and drain regions of the second transistor. A selective nitridation is performed on the source and drain regions of the second transistor.

Also described herein is a method of forming a FinFET, wherein the method includes providing an assembly of a complementary pair of transistors in a fin configuration comprising a first transistor and a second transistor. A block mask is placed over the first transistor. An etch is performed of a spacer over a gate region of the second transistor. The block mask is removed from the first transistor. An epitaxial growth is performed on the source and drain regions of the second transistor. A selective nitridation is performed on the source and drain regions of the second transistor.

Also described is a complementary pair of FinFETs comprising a first transistor and a second transistor. Each transistor includes at least one fin having an active region and a non-active region, a channel region in the active region of the at least one fin, a source region and a drain region in the active region of the at least one fin, and a gate region around the channel region. The gate region controls a flow of current from the source region through the channel region into the channel region. The transistors are formed by receiving an assembly of a complementary pair of transistors in a fin configuration comprising a first transistor and a second transistor. Thereafter, an etch of a spacer is performed over a gate region of both the first transistor and the second transistor. An oxide is deposited over the source region and the drain region of both the first transistor and the second transistor. A block mask is placed over the first transistor. The oxide is removed from the source region and drain region of the second transistor. An epitaxial growth is performed on the source and drain regions of the second transistor. A selective nitridation is performed on the source and drain regions of the second transistor.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings in which:

DETAILED DESCRIPTION

It is understood in advance that although a detailed description of an exemplary FinFET configuration having a certain configuration is presented herein, implementation of the teachings recited herein are not limited to any particular FinFET structure described herein. Rather, embodiments of the present invention are capable of being implemented in conjunction with any other type of fin-based transistor device now known or later developed.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the terms "invention" or "present invention" are non-limiting terms and not intended to refer to any single aspect of the particular invention but encompass all possible aspects as described in the specification and the claims.

Described herein is a method of making a semiconductor structure with the use of a nitride that is selectively grown on a conductor. Previous methods had difficulty growing equal spacers on n-type FET (NFET) and p-type FET (PFET). Conventional methods have different dimensions of spacers for n-type FET and p-type FET. In general, it is preferable to have equal dimensions such that the gate capacitances of n-type FET and p-type FET are the same for circuit design. In addition, the height of the gate might be different for n-type FET and p-type FET. When performing a chemical mechanical polish on the POC liner, if the gate heights are uneven, then an overpolish can be the result, resulting in non-uniformity in the width of the gate. N-type FETs and p-type FETs with different characteristics can be problematic. To get around these difficulties, one had to resort to multiple patterning or a significant process flow change, which adds to the cost and time in creating semiconductor devices. Embodiments described herein avoid such problems through the use of a nitride grown on a conductor instead of growing a nitride on a poly-open chemical mechanical polish (POC) liner.

Figure 1:
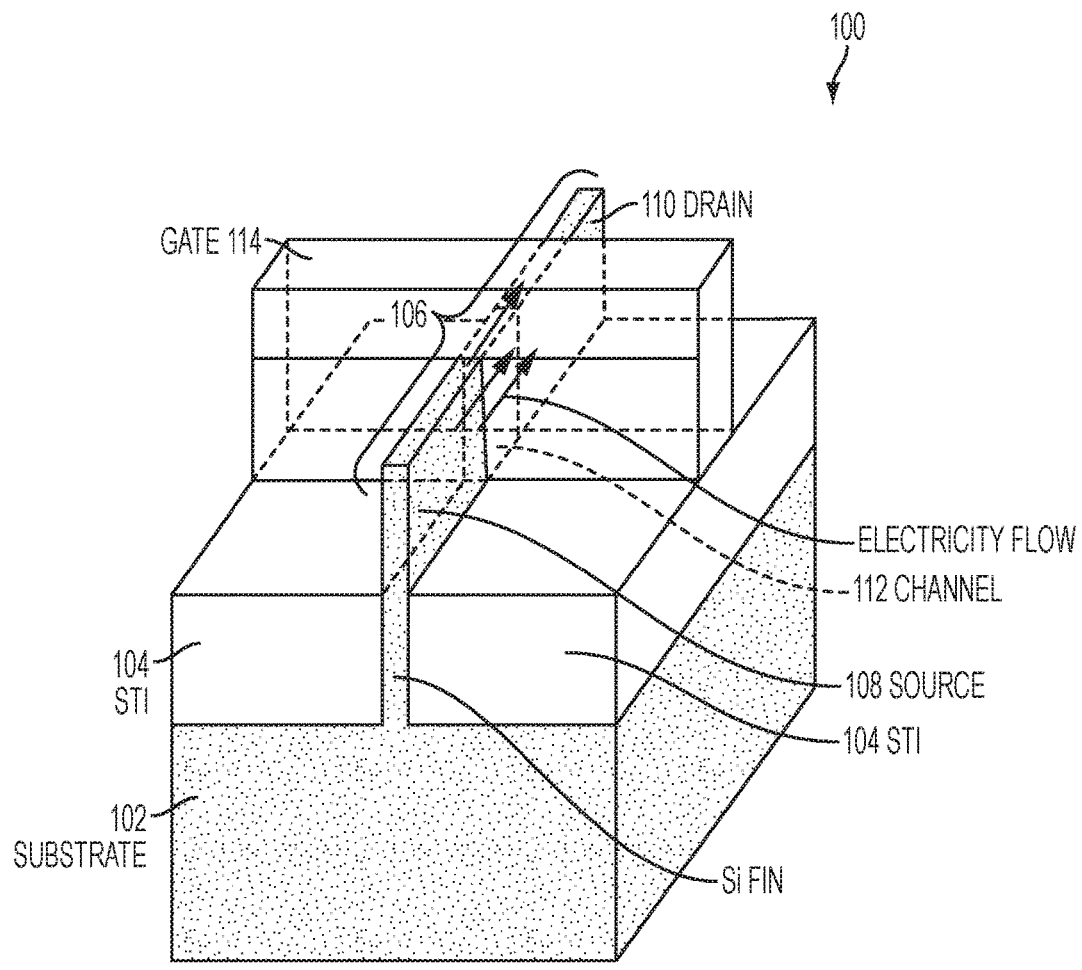
FIG. 1 depicts a three-dimensional view of an exemplary configuration of a known FinFET device.
Figure 2:
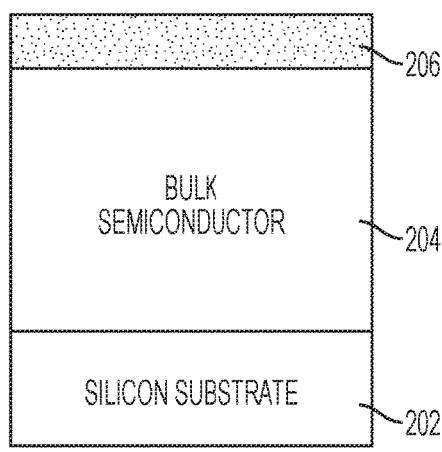
FIG. 2 depicts a semiconductor substrate, a bulk semiconductor material and a hard mask layer.
Figure 3:
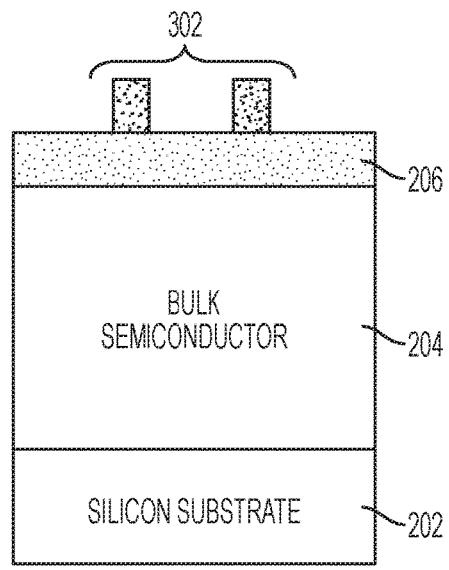
FIG. 3 depicts a patterned resist formed on the structure of FIG. 2.
Figure 4:
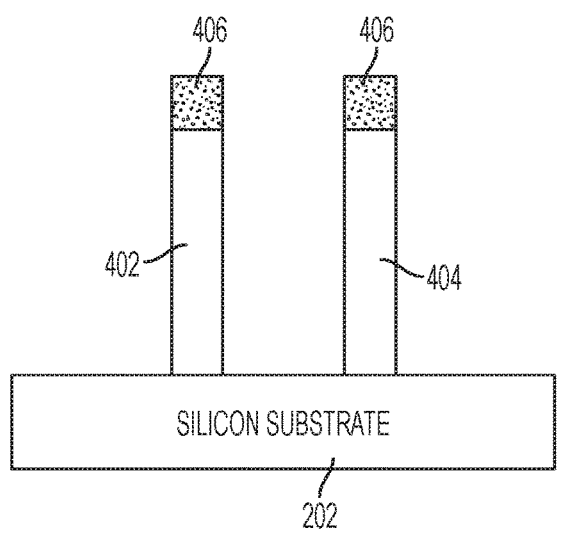
FIG. 4 depicts etching of the resist pattern into the hard mask layer and the bulk semiconductor material.

A preliminary fabrication methodology for forming initial stages of a FinFET semiconductor device in accordance with one or more embodiments of the present invention will now be described with reference to FIGS. 2-7C. Referring now to FIG. 2, an initial structure is formed having semiconductor substrate 202, a bulk semiconductor material 204 and a hard mask layer 206, configured and arranged as shown. It should be noted that the devices described herein are typically constructed on a wafer. It is noted that bulk semiconductor material 204 and semiconductor substrate 202 may be substantially the same material. Hard mask layer 206 may be a silicon nitride material (e.g., $Si_3Ni_4$). In FIG. 3, a patterned resist 302 is added over hard mask layer 206 to pattern and form fins 402, 404 (shown in FIG. 4) from bulk semiconductor 204. Fins 402, 404 may be formed by applying an anisotropic etch process, which results in the structure shown in FIG. 4. Because there is no stop layer on semiconductor substrate 202, the etch process is time based. Remaining portions 406 of the hard mask layer 206 may then optionally be removed from the fins 402, 404.

Figure 5B:
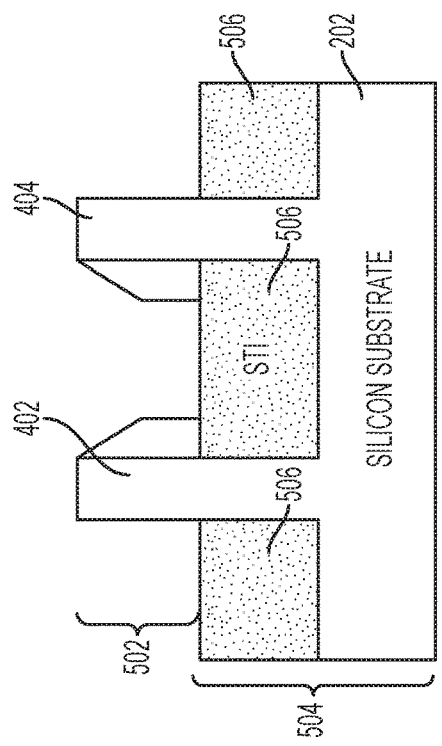
FIG. 5B depicts a cross-sectional view of the semiconductor device shown in FIG. 5A, taken along line 5B-5B.
Figure 5C:
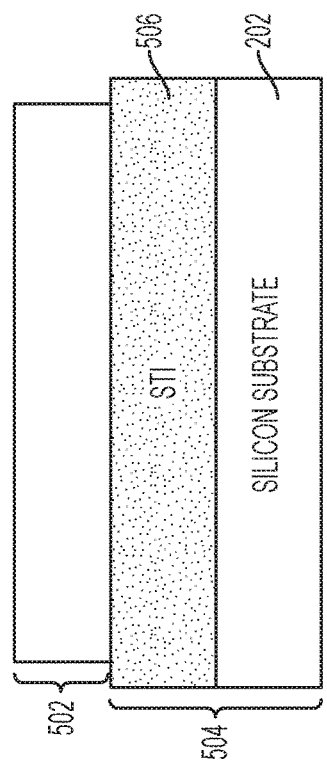
FIG. 5C depicts a cross-sectional view of the semiconductor device shown in FIG. 5A, taken along line 5C-5C.
Figure 5A:
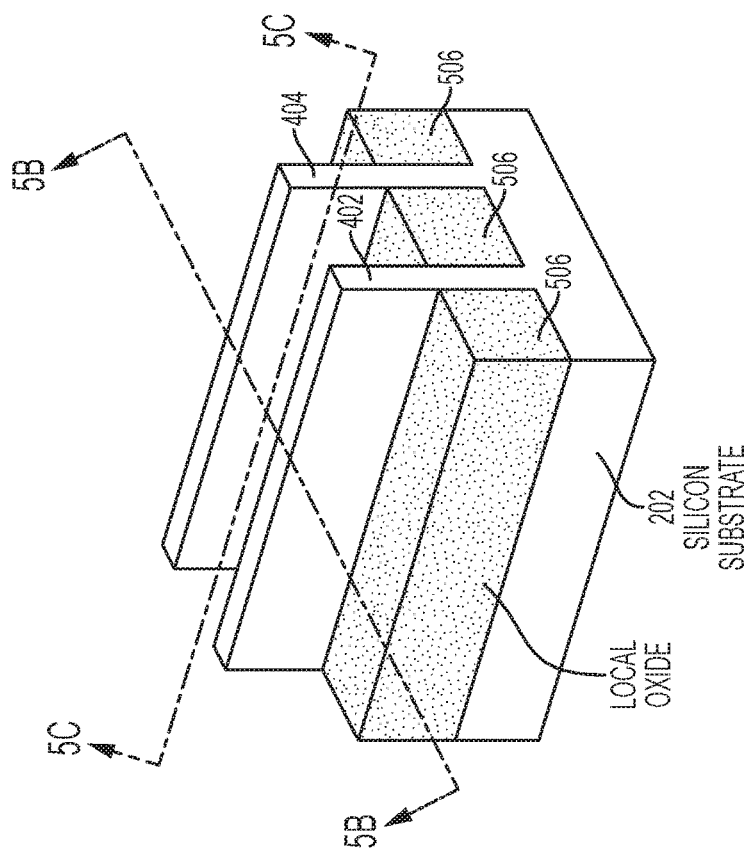
FIG. 5A depicts a three-dimensional view of a semiconductor device after an initial fabrication stage according to one or more embodiments.

In FIGS. 5A, 5B and 5C, a local oxide (e.g., $SiO_2$) is deposited between fins 402, 404 and over substrate 202. The local oxide is polished and recessed back to form STI regions 506, and to expose upper portions 502, 504 of fins 402, 404. FIG. 5A depicts a three-dimensional view of a semiconductor device after an initial fabrication stage according to one or more embodiments. Additionally, FIG. 5B depicts a cross-sectional view of the semiconductor device shown in FIG. 5A, taken along line 5B-5B, and FIG. 5C depicts a cross-sectional view of the semiconductor device shown in FIG. 5A, taken along line 5C-5C. As shown in FIGS. 5A, 5B and 5C, the semiconductor device after this initial stage includes silicon substrate 202, STI regions 506 (approximately 60 nanometers) formed from a local oxide, fins 402, 404, active region 502, and inactive region 504, configured and arranged as shown.

Figure 6B:
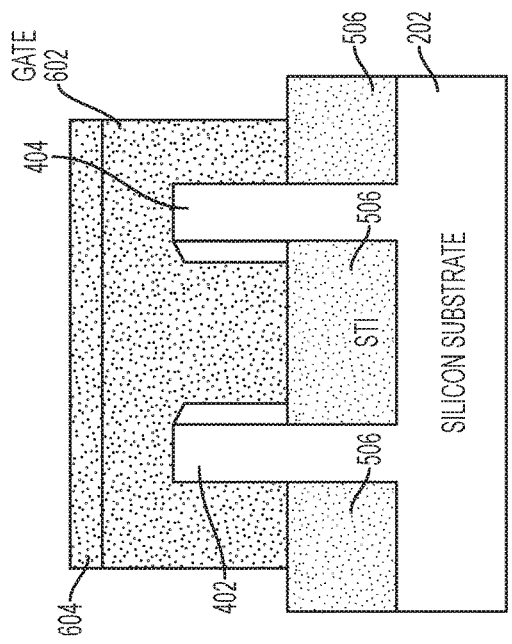
FIG. 6B depicts a cross-sectional view of the semiconductor device shown in FIG. 6A, taken along line 6B-6B.
Figure 6C:
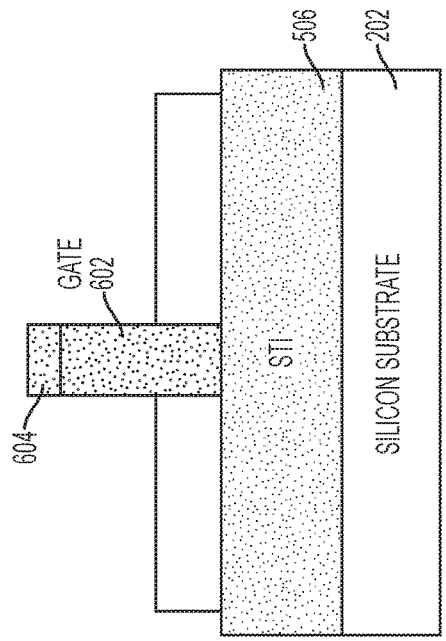
FIG. 6C depicts a cross-sectional view of the semiconductor device shown in FIG. 6A, taken along line 6C-6C.
Figure 6A:
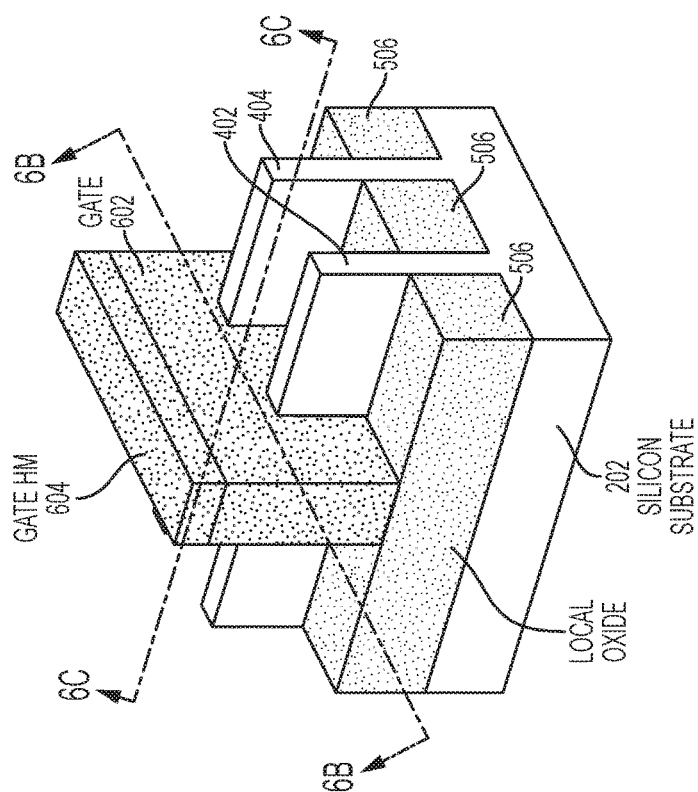
FIG. 6A depicts a cross-sectional view of a semiconductor device after an intermediate fabrication stage according to one or more embodiments.

As shown in FIGS. 6A, 6B and 6C, a gate 602 is formed over exposed upper portions of fins 402, 404 using an HK deposition process. Gate 602 may be either a high-K material or a dummy oxide. A dummy oxide would be used for device configurations in which gate 602 will be replaced in subsequent processing steps by a metal gate. Prior to forming gate 602, a hydrogen fluoride (HF) pre-clean is performed to clean the deposition surface prior to deposition. As also shown in FIGS. 6A, 6B, and 6C, a hard mask (HM) 604 is deposited over gate 602. The portions of fins 402, 404 that are surrounded by gate 602 form the channel region of the device.

Figure 7A:
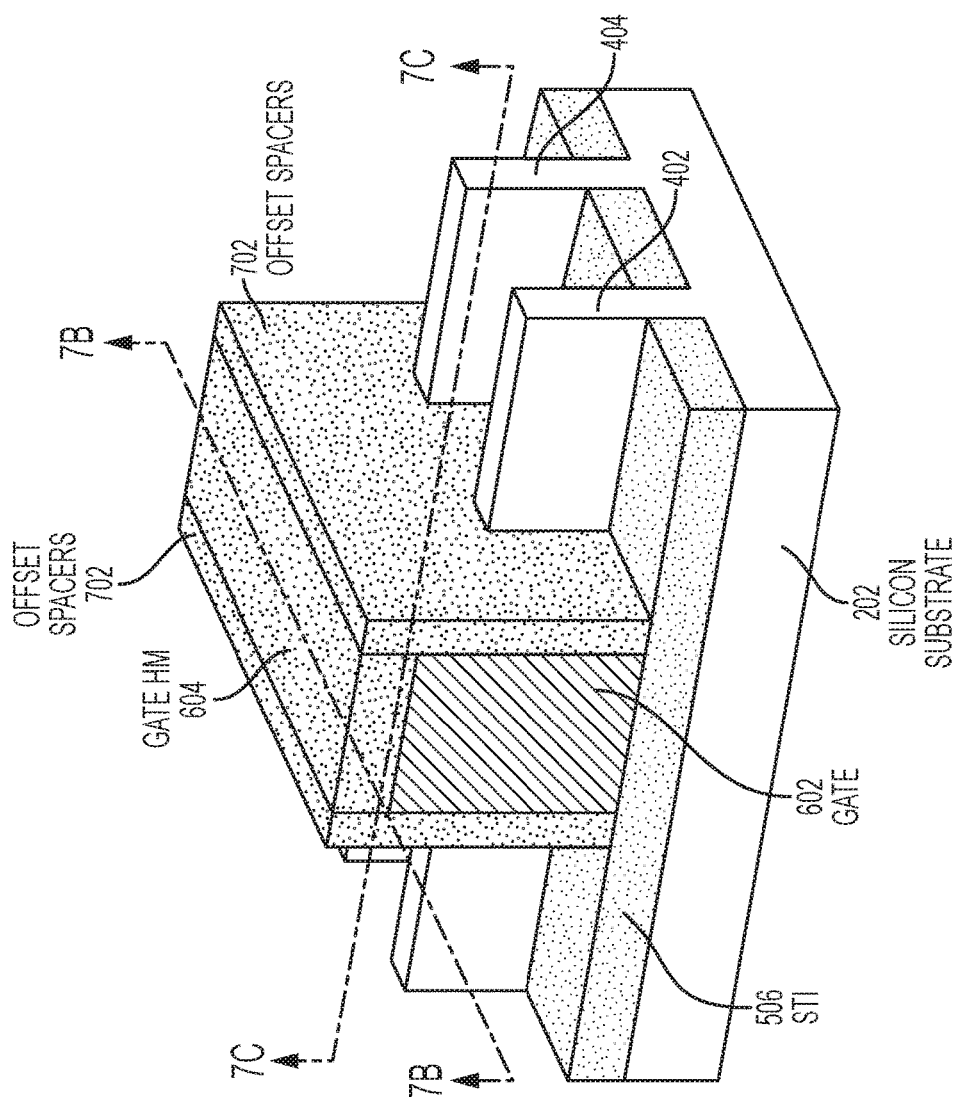
FIG. 7A depicts a cross-sectional view of a semiconductor device after an intermediate fabrication stage according to one or more embodiments.
Figure 7C:
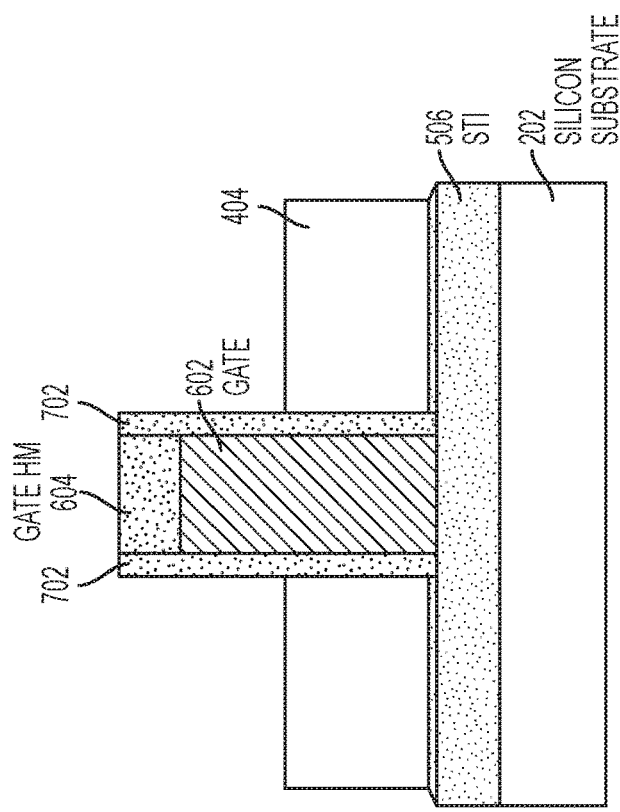
FIG. 7C depicts a cross-sectional view of the semiconductor device shown in FIG. 7A, taken along line 7C-7C.
Figure 7B:
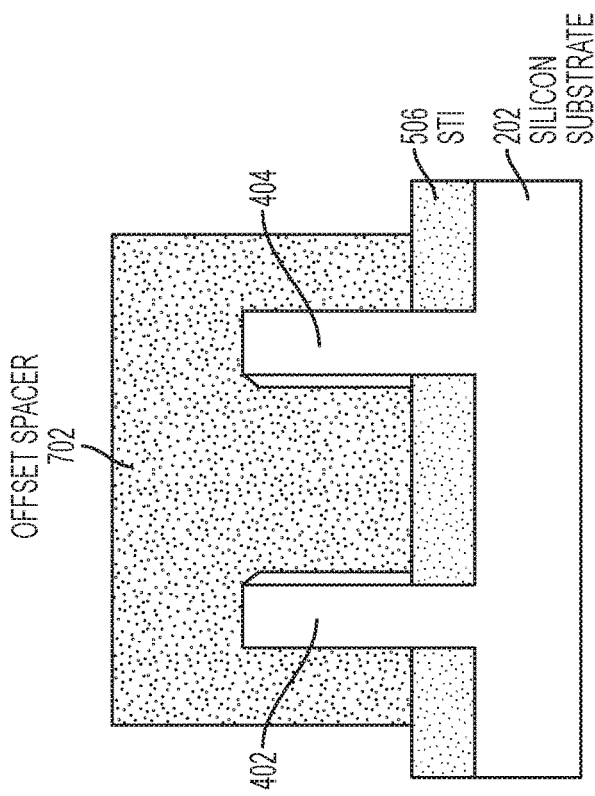
FIG. 7B depicts a cross-sectional view of the semiconductor device shown in FIG. 7A, taken along line 7B-7B.

As shown in FIGS. 7A, 7B and 7C, offset spacers 702 are formed along the sidewalls of gate 602, as shown. Offset spacers 702 may be formed using a spacer pull down formation process. Offset spacers 702 may also be formed using a sidewall image transfer (SIT) spacer formation process. The spacer might comprise SiN, or SiBCN, or SiOCN (low-K materials).

Figure 8:
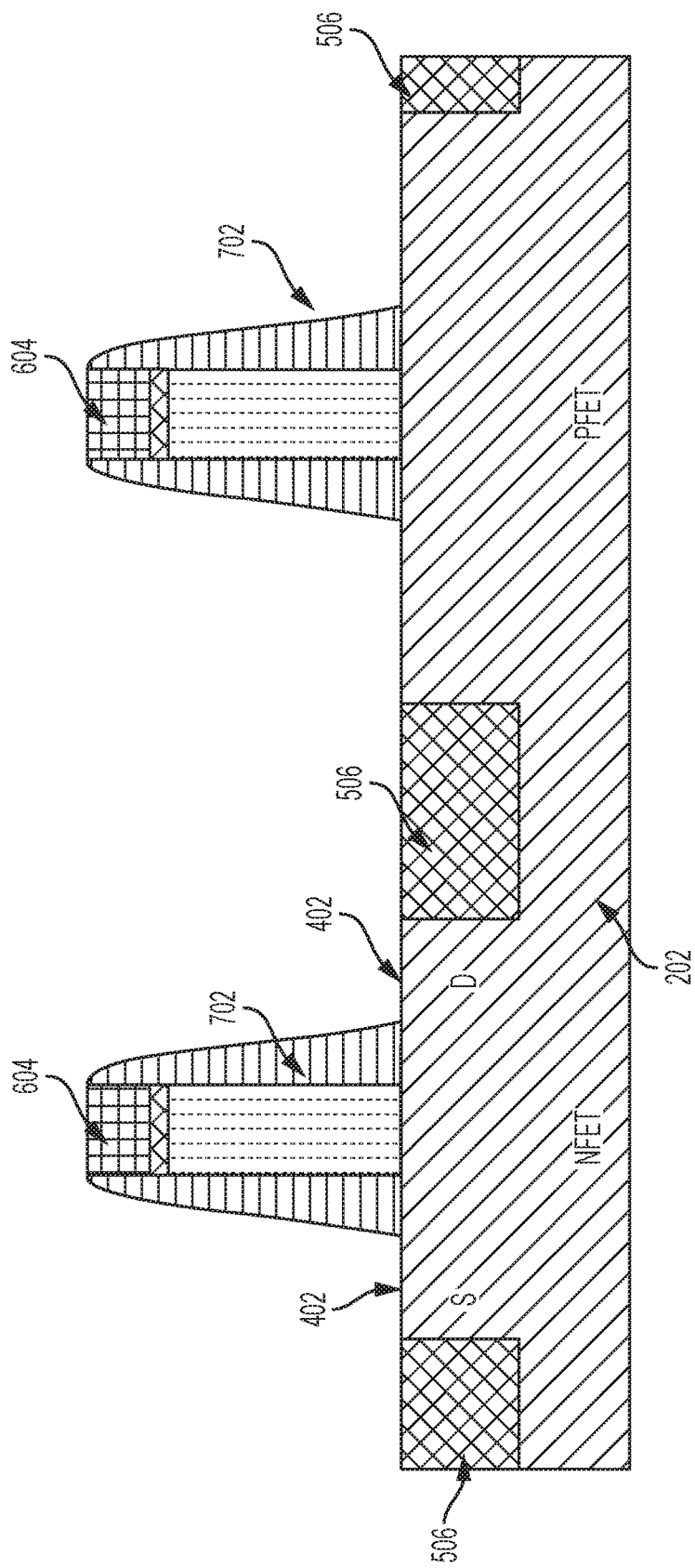
FIG. 8 depicts the etching of gate spacers.
Figure 16:
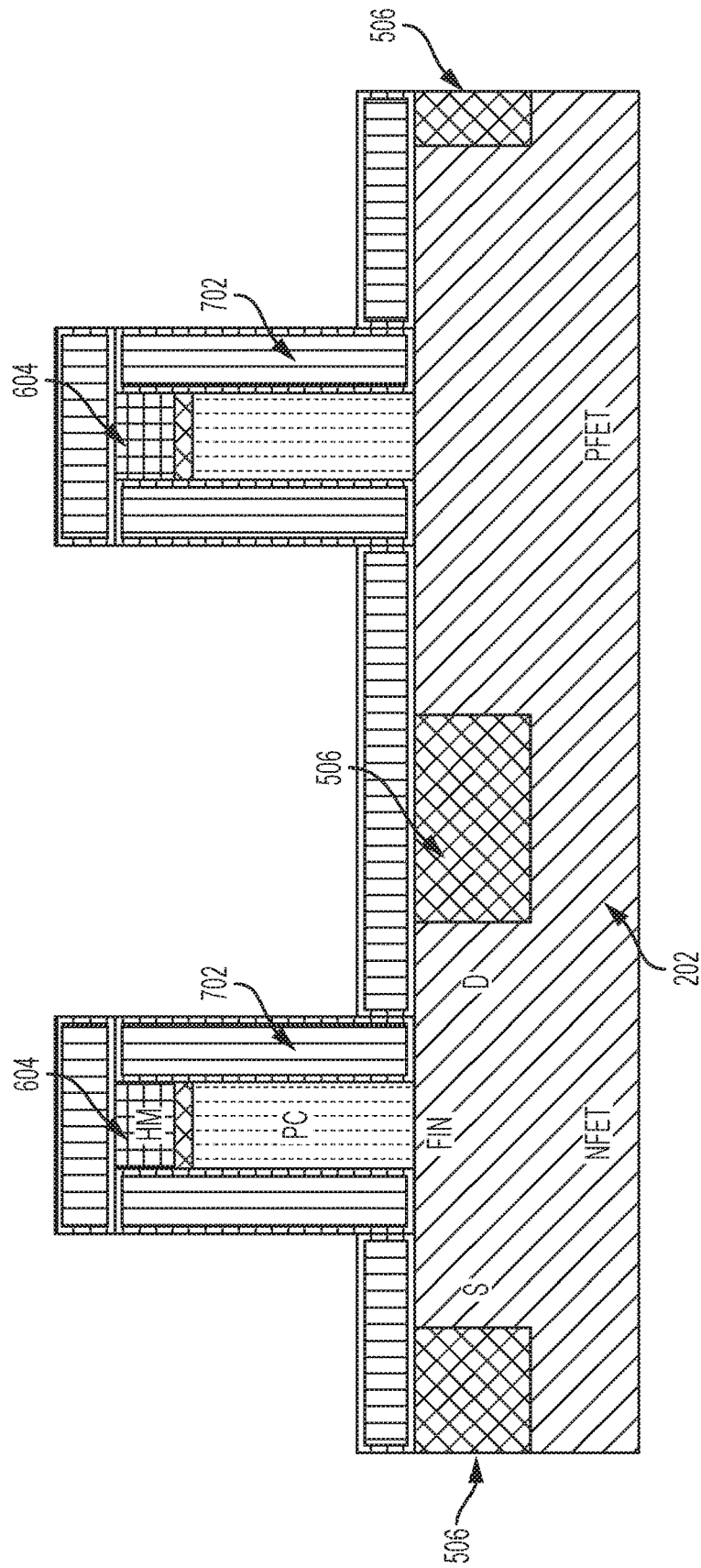
FIG. 16 depicts the gate spacers prior to etching.

Continuing from the same view as FIG. 7C, FIG. 16 illustrates the process following the formation of spacers 702. FIG. 16 expands on the previous figures in that both an n-type FET on the left side and a p-type FET on the right side are illustrated in FIG. 16. In FIG. 8, a reactive ion etch (RIE) is performed on the spacers 702, resulting in an equal spacer on both the spacer 702 on the n-type FET and the spacer on the p-type FET.

Figure 9:
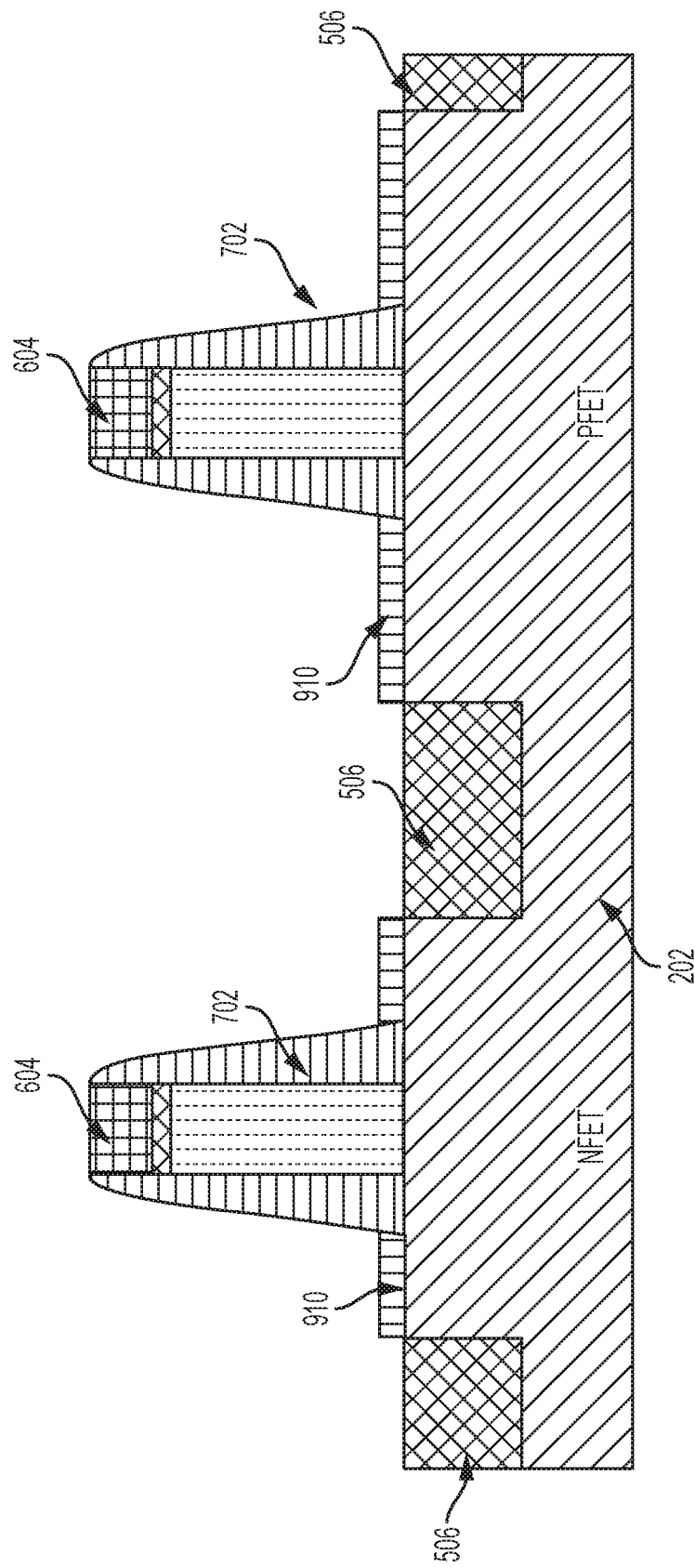
FIG. 9 depicts the depositing of oxide on source and drain regions.

In FIG. 9, an oxide 910 is deposited in the area where the source and drain will be placed. In some embodiments, the oxide might be a silicon oxide ($SiO_2$). The oxide can be applied in a variety of different manners. A high-density plasma (HDP) oxide deposition can be used to provide a directional deposition of the oxide on the source and drain areas without getting on the sidewalls of spacer 702. Selective oxidation can also be used. Oxidation would only occur on the source and drain areas, without getting on the sidewalls of spacer 702, hard mask 604, or on STI 506, because the selective oxidation only occurs on semiconductor material. The equal spacer between the n-type FET and the p-type FET is preserved from FIG. 8.

Figure 10:
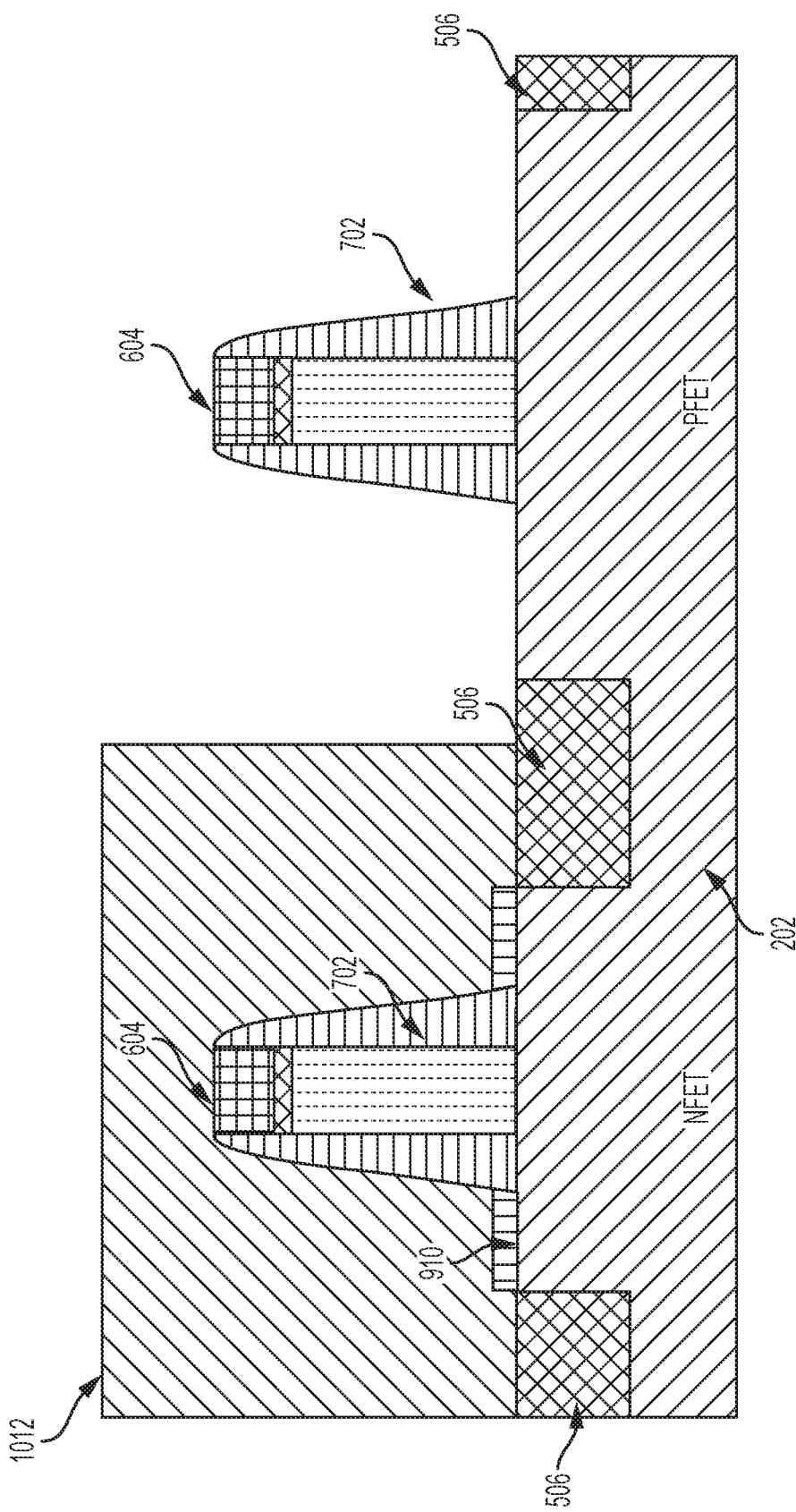
FIG. 10 depicts the depositing of a block mask.

In FIG. 10, a block mask 1012 is placed over one of the FET structures. In the embodiment shown in FIG. 10, block mask 1012 is placed over the n-type FET structure, with the p-type FET remaining unmasked. Block mask 1012 might be an organic photoresist, such as an organic dielectric layer (ODL), deposited in any manner now known or later developed. With the n-type FET being covered by block mask 1012, oxide 910 is removed from the p-type FET. This can be performed through the use of a buffered oxide etch. A buffered oxide etch might comprise a buffering agent with hydrofluoric acid (HF). The buffering agent might comprise ammonium fluoride ($NH_4F$). It should be understood that block mask 1012 can be placed over the p-type FET with the n-type FET remaining unmasked. The buffered oxide etch does not affect spacer 702 or hard mask 604.

Figure 11:
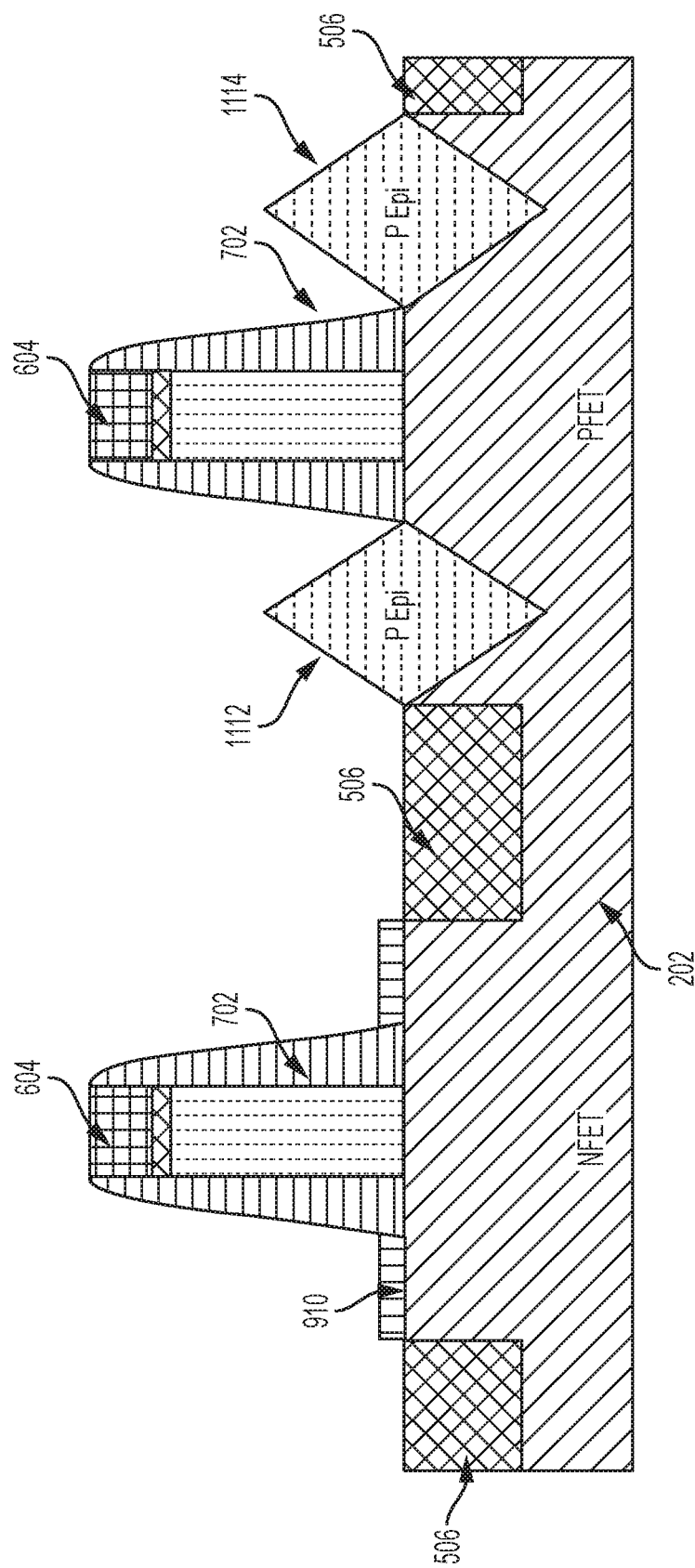
FIG. 11 depicts the removal of the block mask and growth of the source and drain region.

In FIG. 11, the block mask placed in FIG. 10 is removed using one of a variety of techniques known to one of skill in the art. Thereafter, the wafer upon which these devices are being formed is placed in an epitaxy chamber. In the epitaxy chamber, the source region 1112 and drain region 1114 are grown on the p-type FET. This is a self-aligned process in that the epitaxial growth of source region 1112 and drain region 1114 is controlled in that the epitaxial growth occurs only on semiconductor material, such as substrate 202. The presence of oxide 910 prevents epitaxial growth on the n-type FET. The spacer 702, hard mask 604, and the STI 506 prevent epitaxial growth in other regions.

Figure 12:
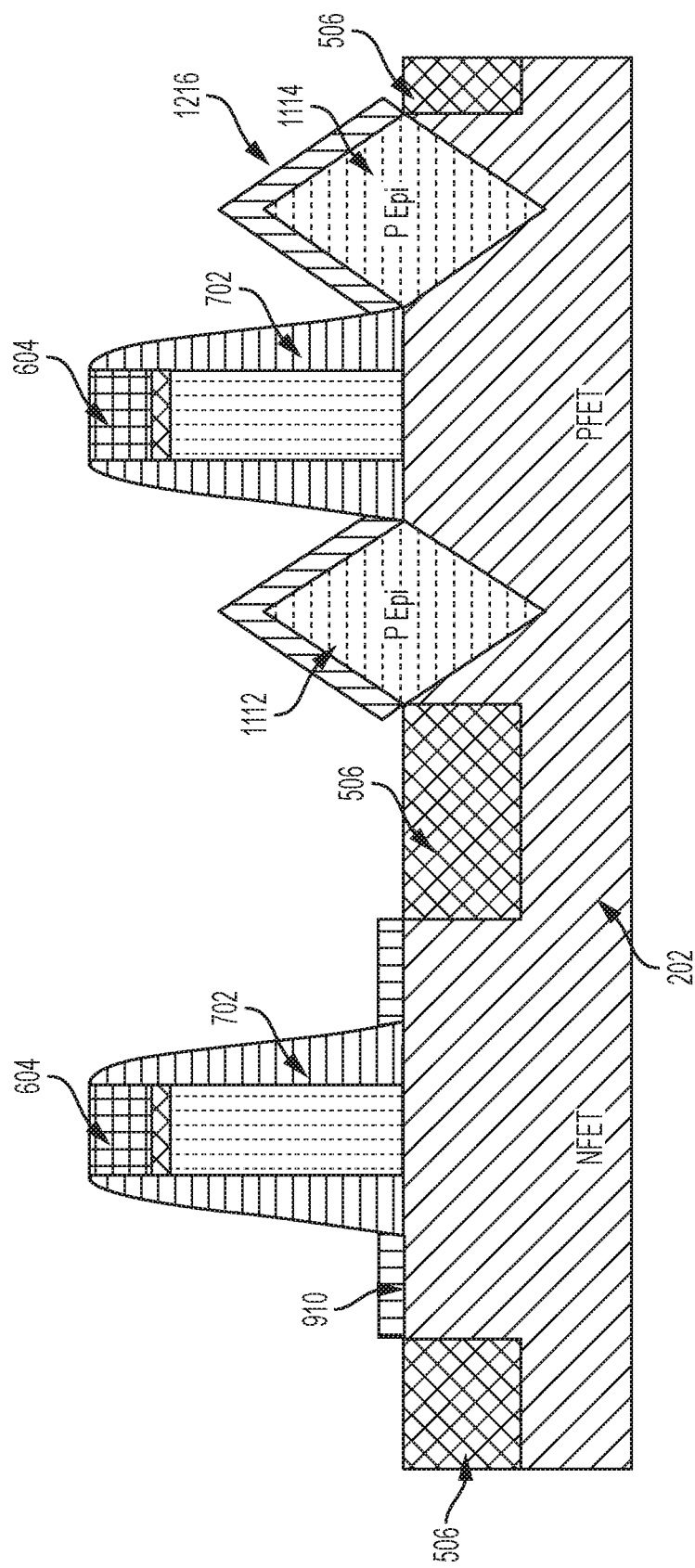
FIG. 12 depicts the selective nitridation on the source and drain regions.

In FIG. 12, a nitride 1216 is placed on the source region 1112 and the drain region 1114. The nitride might be a silicon nitride (SiN). Nitride 1216 might be placed using one of a variety of different methods, such as rapid thermal nitridation, furnace nitridation, remote plasma nitridation, decoupled plasma nitridation, and the like. The presence of oxide 910 prevents any nitride from forming on the n-type FET. In addition, nitride does not form on the gate area because of spacer 702. This nitridation is unique in that it occurs directly on silicon, instead of growing on an oxide such as the silicon oxide 910. In some embodiments, the silicon substrate is an H-terminated silicon substrate. The nitridation also enables the process to continue without the use of a POC liner, as the nitride will perform some of the functions of the POC liner, without the need of the additional steps of depositing a POC liner.

Figure 13:
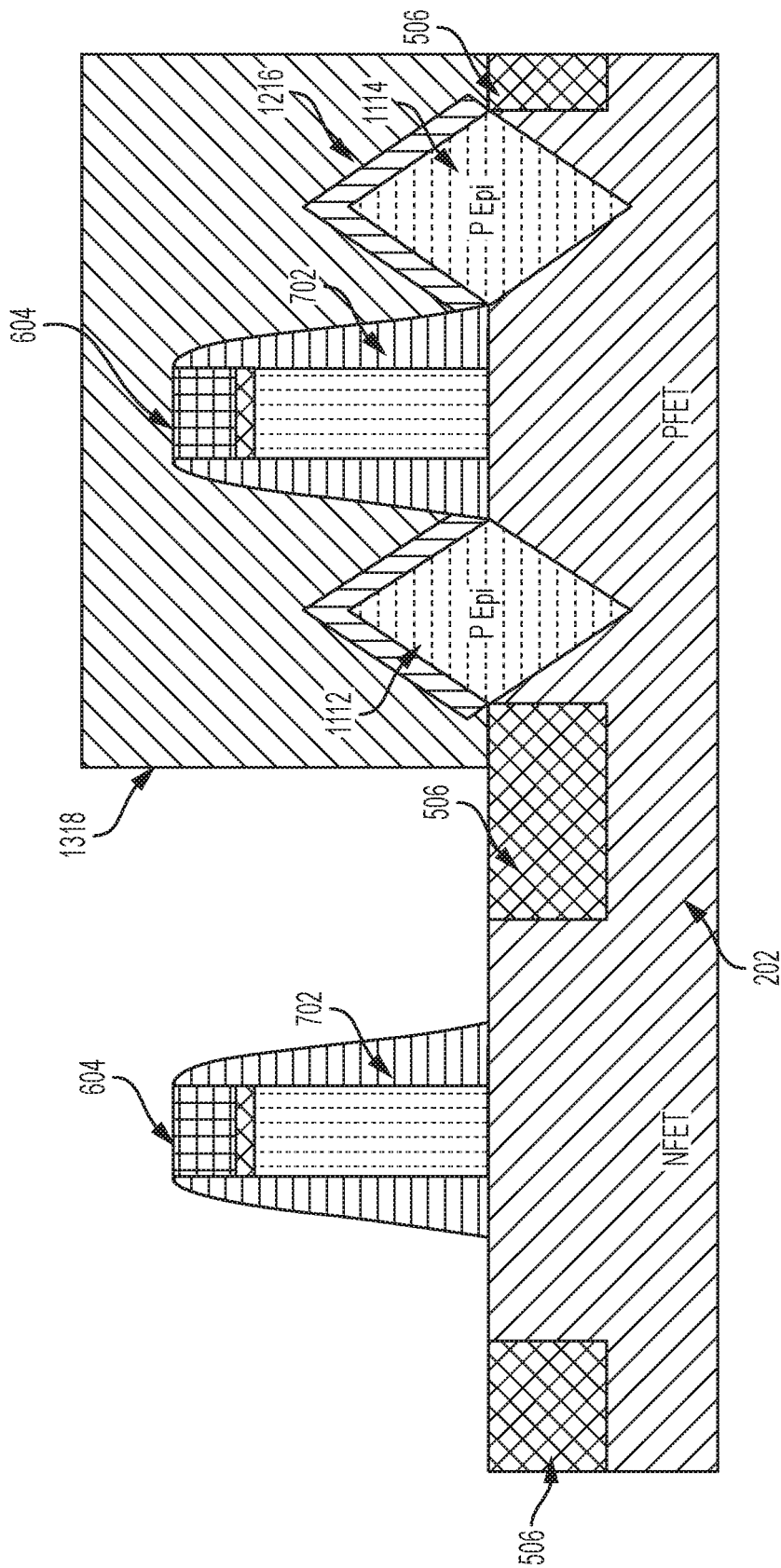
FIG. 13 depicts addition of the block mask.

Thereafter, the process is repeated for the n-type FET. In FIG. 13, a block mask 1318 is placed over the p-type FET structure, with the n-type FET remaining unmasked. Block mask 1318 might be an organic photoresist, such as an organic dielectric layer (ODL). Oxide 910 is removed from the n-type FET. This can be performed through the use of a buffered oxide etch. A buffered oxide etch might comprise a buffering agent with hydrofluoric acid (HF). The buffering agent might comprise ammonium fluoride ($NH_4F$).

Figure 14:
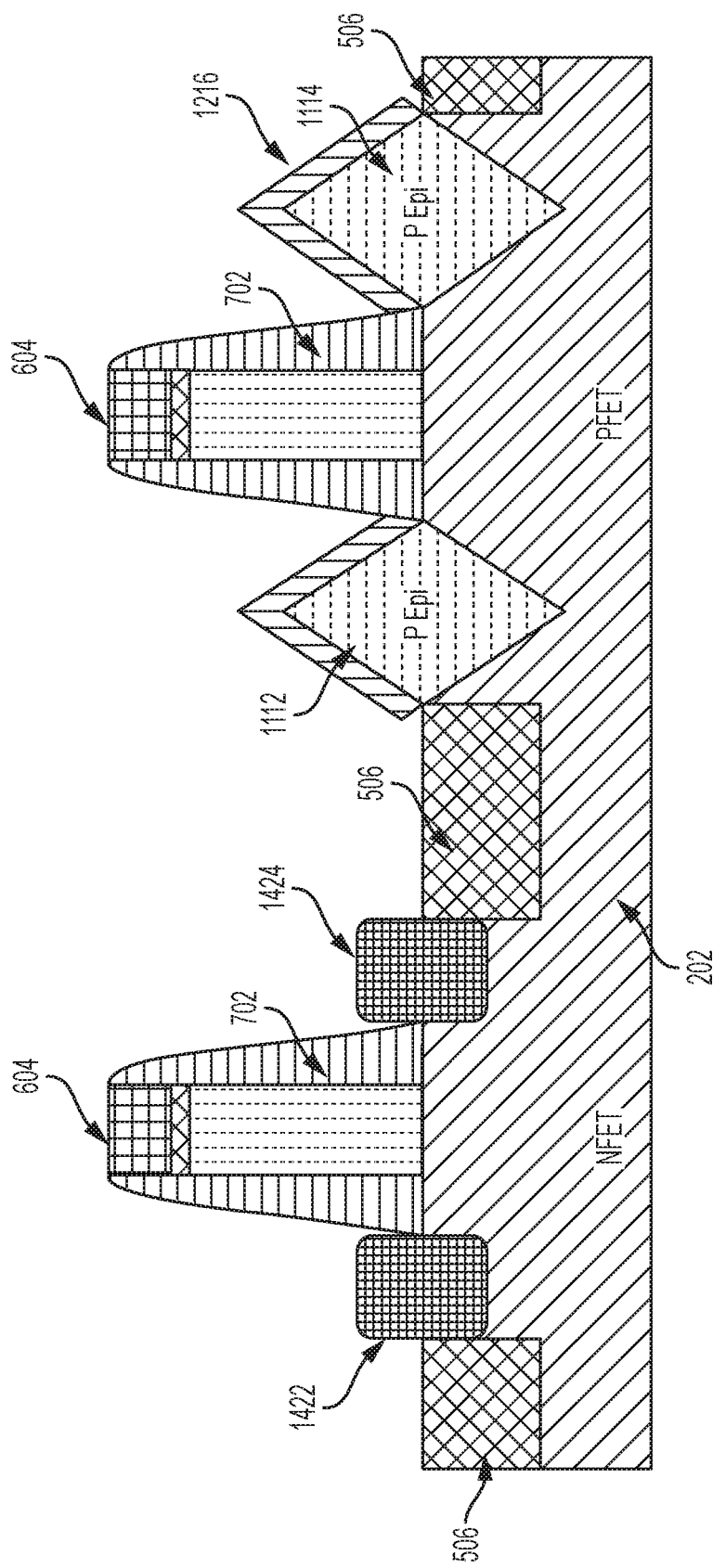
FIG. 14 depicts the epitaxial growth on the source and drain regions.

In FIG. 14, the block mask placed in FIG. 13 is removed using one of a variety of techniques known to one of skill in the art. Thereafter, the wafer is placed in an epitaxy chamber. Here, the source region 1422 and drain region 1424 are grown on the n-type FET. The presence of nitride 1216 prevents epitaxial growth on the p-type FET.

Figure 15:
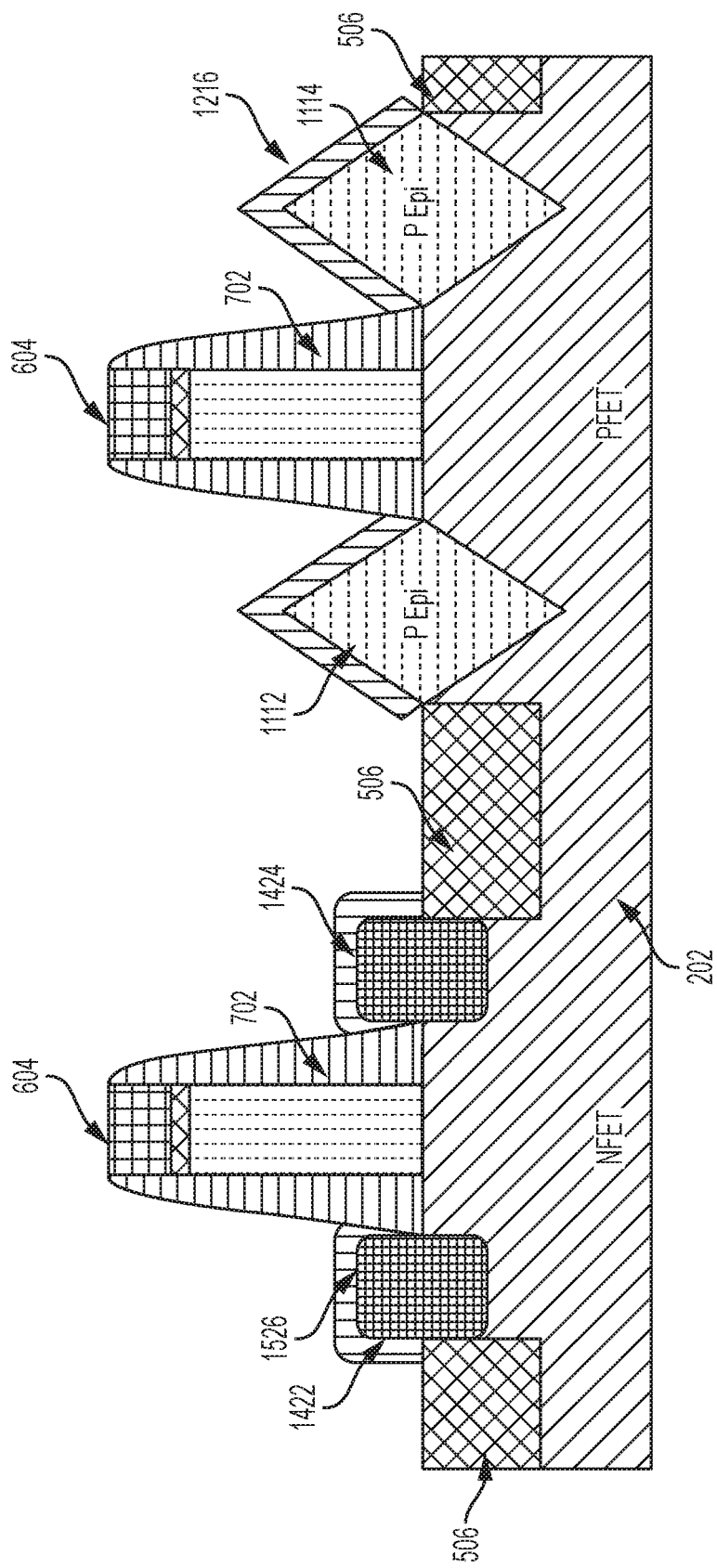
FIG. 15 depicts the nitridation of the source and drain regions.

In FIG. 15, a nitride 1526 is placed on the source region 1422 and the drain region 1424. The nitride might be a silicon nitride (SiN). Nitride 1526 might be placed using a selective nitridation. The presence of an already existing layer of nitride 1216 means that growth of nitride on the p-type FET is very slow, because after approximately 3 nanometers of nitride is present, further growth rates are much slower. From here, methods known in the art are used to complete the fabrication of the devices, such as the depositing of metal layers and other back end-of-line (BEOL) steps and packaging.

An alternative embodiment is shown beginning in FIG. 16. In FIG. 16, as described above, the structure of FIG. 7C is shown with two different types of FET presented side-by-side.

Figure 17:
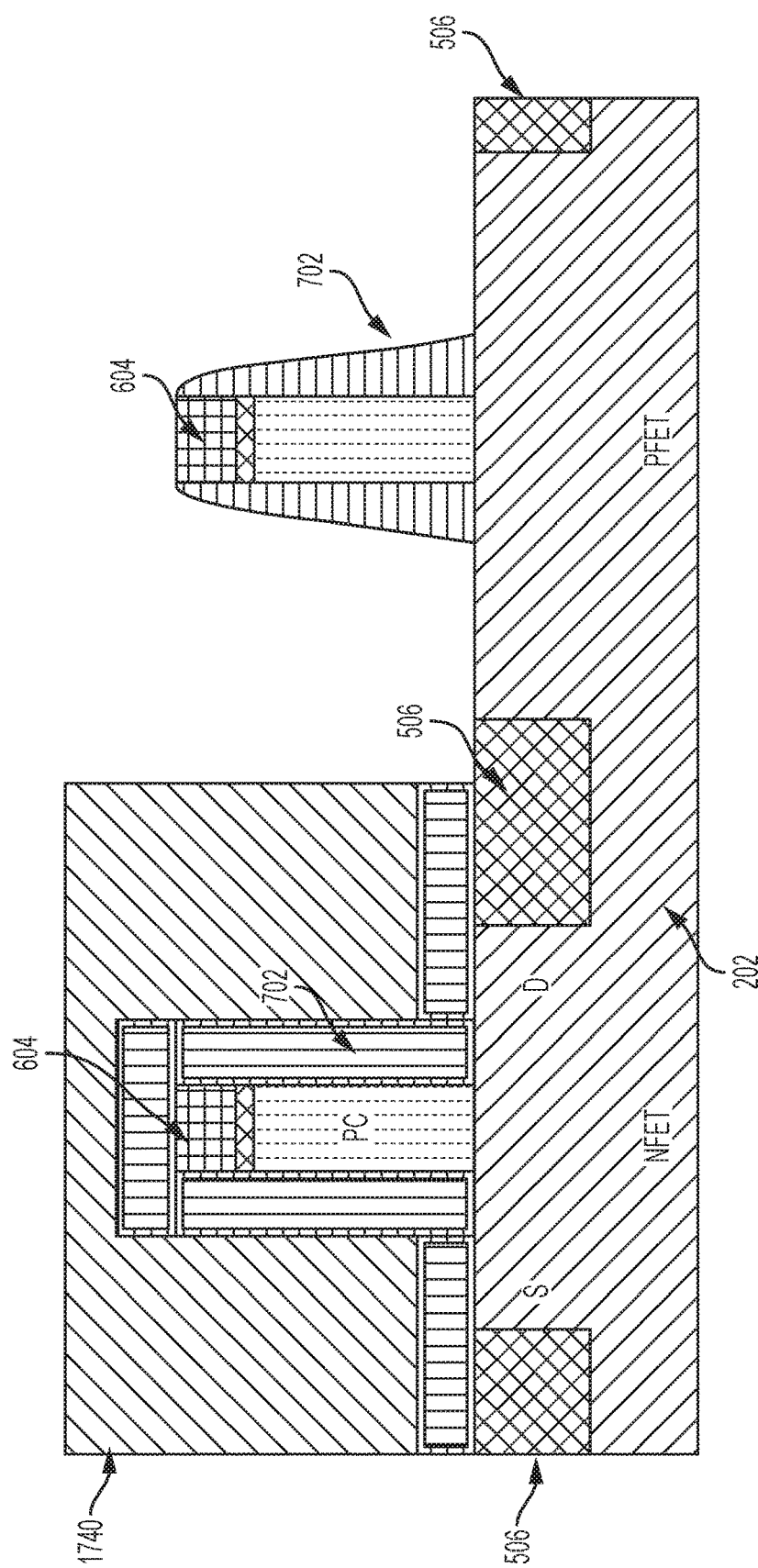
FIG. 17 depicts the depositing of a block mask.

In FIG. 17, a block mask 1740 is placed over one of the FET structures. In the embodiment shown in FIG. 17, block mask 1740 is placed over the n-type FET structure, with the p-type FET remaining unmasked. Block mask 1740 might be an organic photoresist, such as an organic dielectric layer (ODL). With the n-type FET being covered by the block mask, a reactive ion etch is performed on spacer 702 of the p-type FET.

Figure 18:
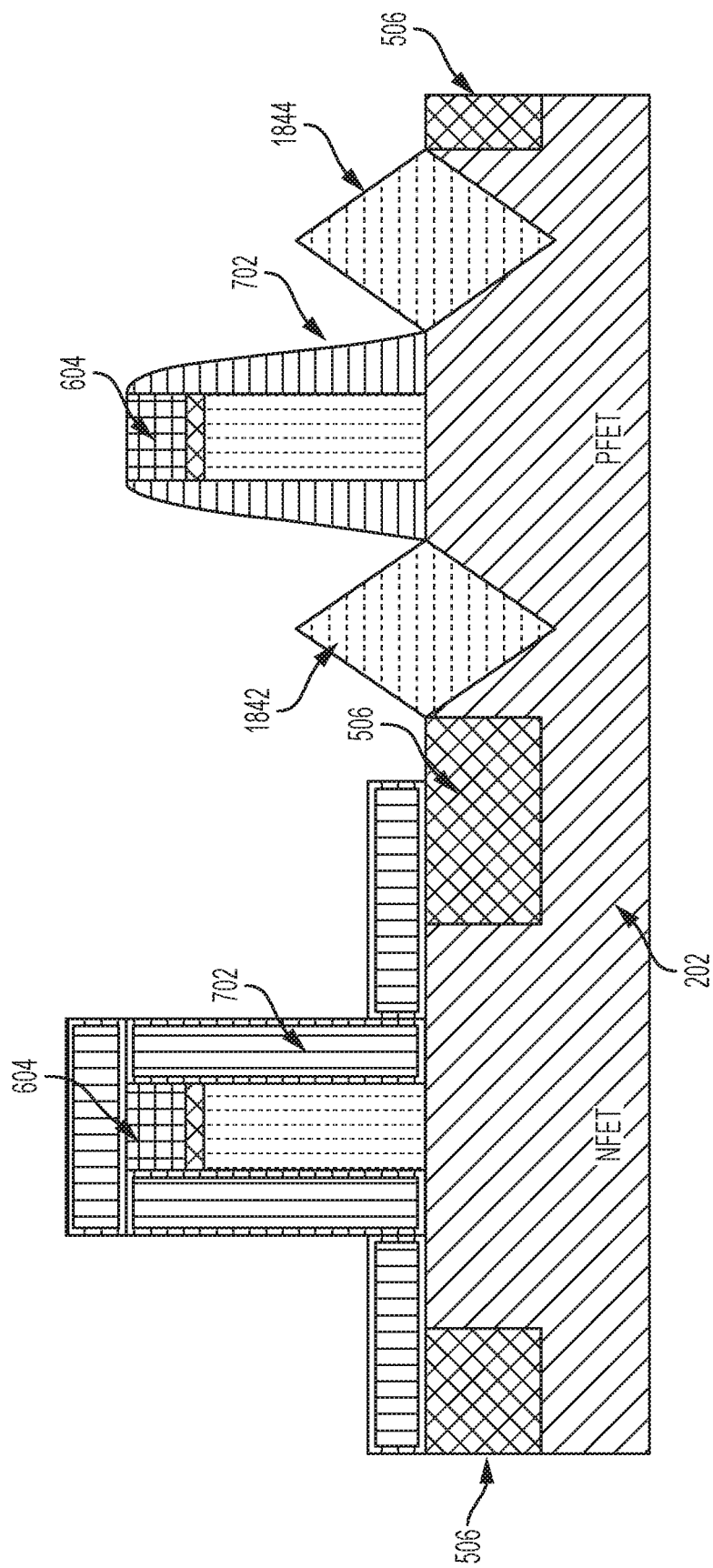
FIG. 18 depicts the removal of the block mask and growth of the source and drain region.

In FIG. 18, the block mask is removed from the n-type FET using one of a variety of techniques known to one of skill in the art. Thereafter, the wafer is placed in an epitaxy chamber. Here, the source region 1842 and drain region 1844 are grown on the p-type FET. The presence of spacer 702 prevents epitaxial growth on the n-type FET.

Figure 19:
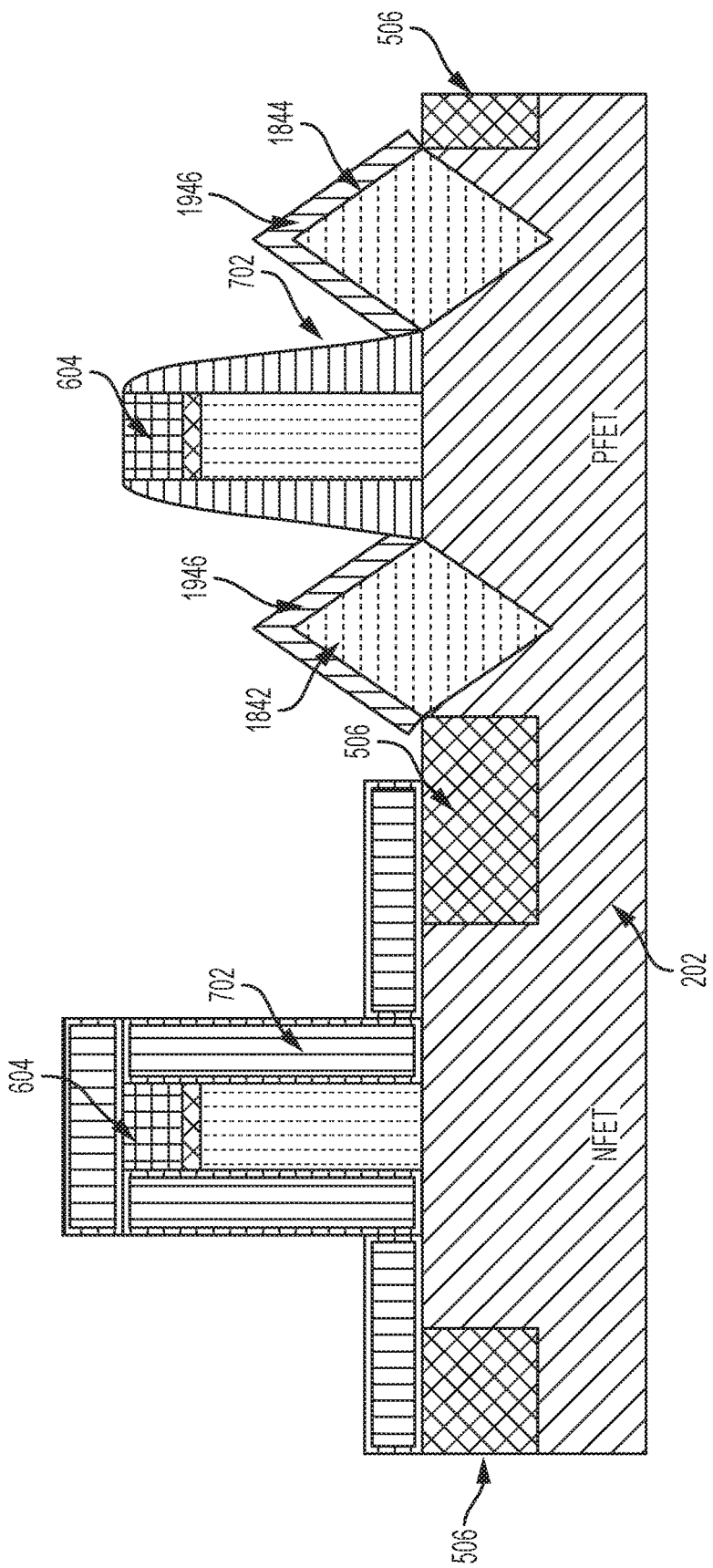
FIG. 19 depicts the selective nitridation on the source and drain regions.

In FIG. 19, a nitride 1946 is placed on the source region 1842 and the drain region 1844. The nitride might be a silicon nitride (SiN). Nitride 1946 might be placed using a selective nitridation. The presence of spacer 702 prevents any nitride from forming on the n-type FET.

Figure 20:
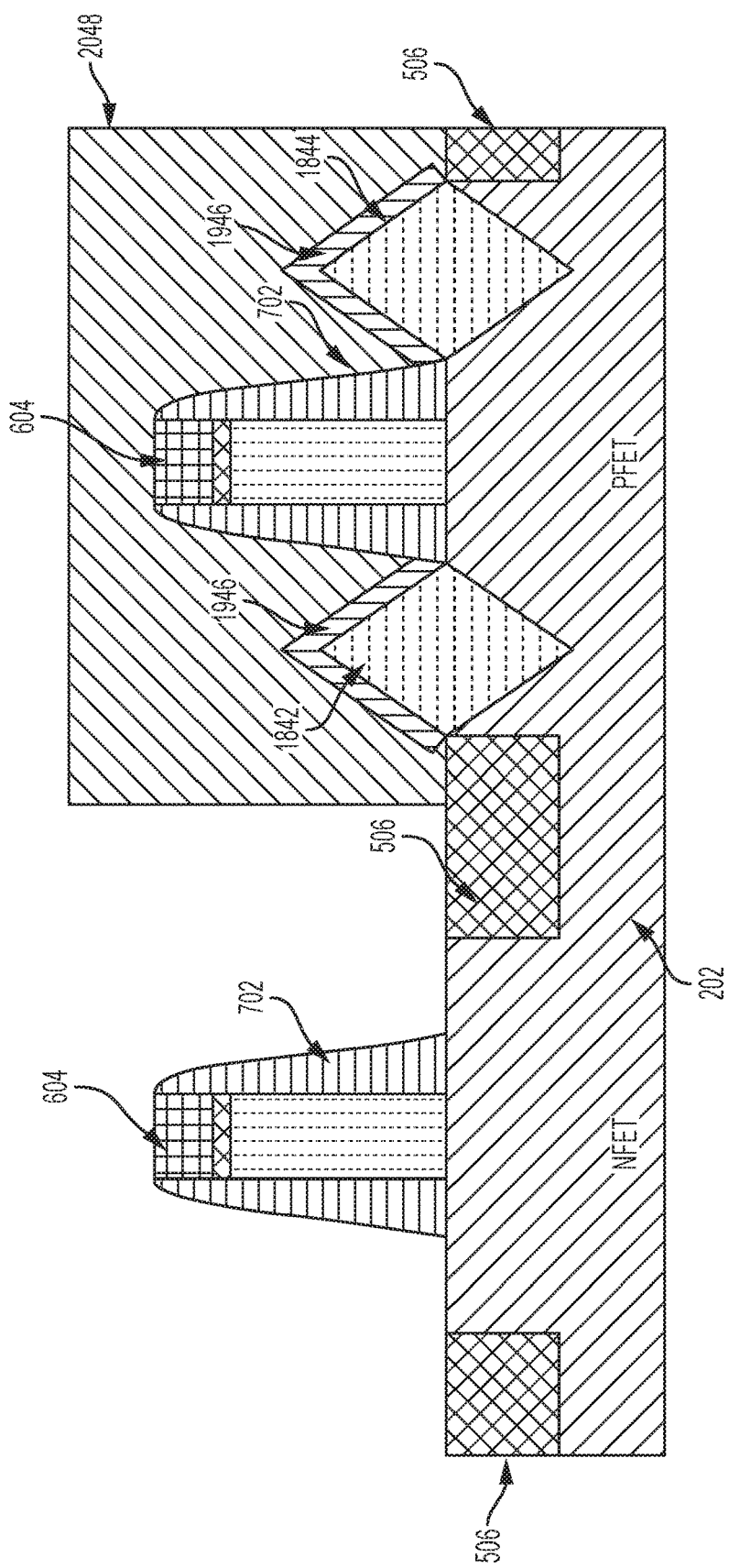
FIG. 20 depicts addition of the block mask.

Thereafter, the process is repeated for the n-type FET. In FIG. 20, a block mask 2048 is placed over the p-type FET structure, with the n-type FET remaining unmasked. Block mask 2048 might be an organic photoresist, such as an organic dielectric layer (ODL). Spacer 702 is etched using an RIE method. Since the same type of RIE is performed on the n-type FET as was performed on the p-type FET as described with respect to FIG. 17, spacer 702 on the n-type FET is the same size as spacer 702 on the p-type FET.

Figure 21:
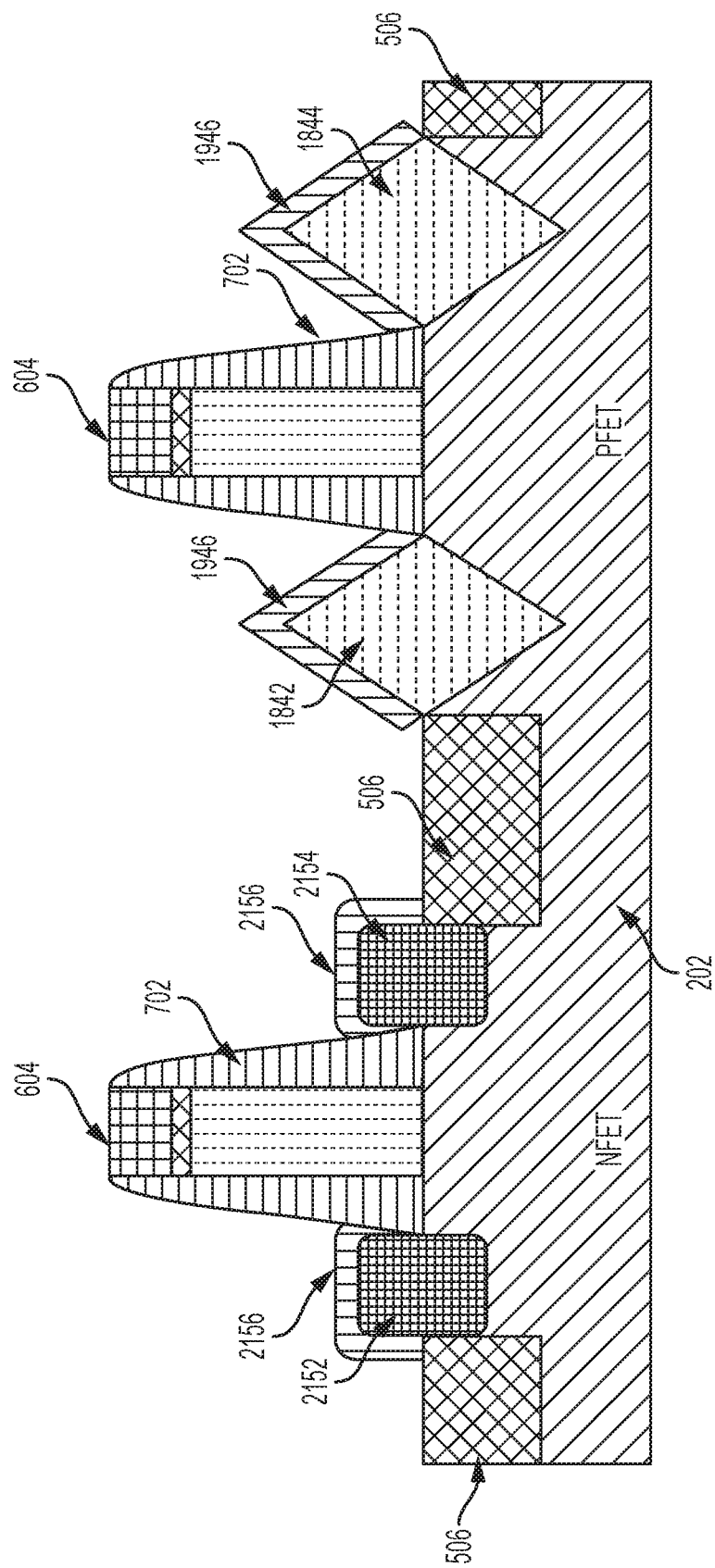
FIG. 21 depicts the epitaxial growth on the source and drain regions.

In FIG. 21, the block mask placed in FIG. 20 is removed using one of a variety of techniques known to one of skill in the art. Thereafter, the wafer is placed in an epitaxy chamber. Here, the source region 2152 and drain region 2154 are grown on the n-type FET. The presence of nitride 1946 prevents epitaxial growth on the p-type FET.

Thereafter, a nitride 2156 is placed on the source region 2152 and the drain region 2154. The nitride might be a silicon nitride (SiN). Nitride 2156 might be placed using a selective nitridation. The presence of an already existing layer of nitride 1216 means that growth of nitride on the p-type FET is very slow, because after approximately 3 nanometers of nitride is present, further growth rates are much slower.

From here, methods known in the art are used to complete the fabrication of the devices, such as the depositing of poly layers, metal layers, and other back end-of-line (BEOL) steps and packaging.

Figure 22:
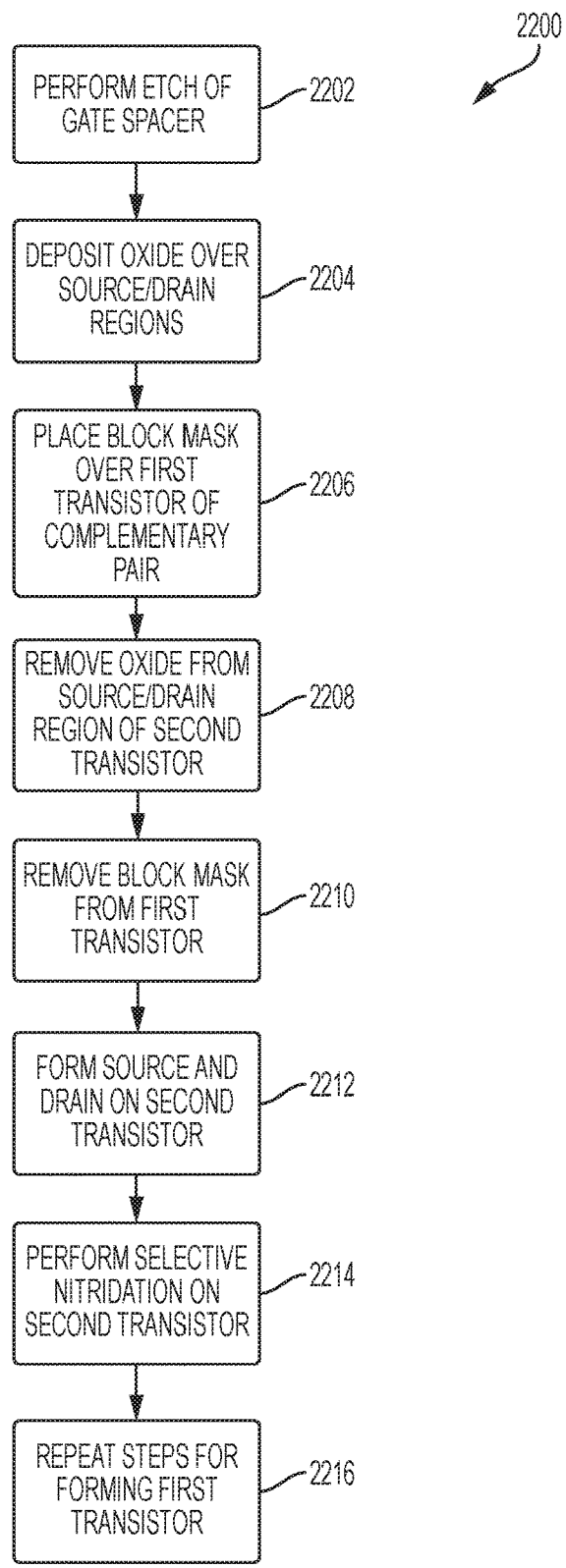
FIG. 22 is a flow diagram illustrating a methodology according to one or more embodiments.

FIG. 22 is a flow diagram illustrating a methodology 2200 according to one or more embodiments. Method 2200 is merely exemplary and is not limited to the embodiments presented herein. Method 2200 can be employed in many different embodiments or examples not specifically depicted or described herein. In some embodiments, the procedures, processes, and/or activities of method 2200 can be performed in the order presented. In other embodiments, the procedures, processes, and/or activities of method 2200 can be performed in any other suitable order. In still other embodiments, one or more of the procedures, processes, and/or activities of method 2200 can be combined or skipped.

Method 2200 begins with a FinFET assembly similar to that depicted in FIG. 16, with the spacer already applied. The FinFET assembly comprises a pair of complementary transistors, one being a p-type transistor, one being an n-type transistor. One of the transistors will be referred to as the first transistor and the other transistor will be referred to as the second transistor. In some embodiments, the n-type transistor will be the first transistor and the p-type transistor will be the second transistor. In other embodiments, the p-type transistor will be the first transistor and the n-type transistor will be the second transistor. It should be understood that method 2200 is merely an overview of the process. Further details for each block is given above.

At block 2202, an etch is performed of the gate spacer. This etch can be a reactive ion etch. At block 2204, an oxide is deposited over the source and drain regions of both the first transistor and the second transistor. At block 2206, a block mask is placed over the first transistor. At block 2208, oxide is removed from the source and drain regions of the second transistor. At block 2210, the block mask is removed from the first transistor. At block 2212, a source and drain are epitaxially grown on the second transistor. The oxide on the first transistor prevents the growth of the source and drain regions of the first transistor. At block 2214, a selective nitridation is performed on the second transistor. At block 2216, blocks 2206 through block 2214 are repeated with the blocks performed earlier on the first transistor being performed on the second transistor and vice versa. In other words, a block mask is placed over the second transistor; oxide is removed from the source and drain regions of the first transistor; the block mask is removed from the second transistor; a source and drain are epitaxially grown on the first transistor. The nitride on the second transistor prevents the growth of the source and drain regions of the second transistor. At block 2214, a selective nitridation is performed on the first transistor.

Thus, it can be seen from the forgoing detailed description and accompanying illustrations that embodiments of the present invention provide structures and methodologies for providing equal spacers for n-type FET and p-type FET without resorting to multiple patterning—a single process can be used for both n-type FET and p-type FET. Methodologies provide for a method of creating equal spacers on n-type FET and p-type FET with a self-aligned source/drain epitaxial growth. A self-aligned silicon nitride liner is grown directly on silicon for protection of the source and drain regions in the embodiments described herein. The elimination of the POC liner results in a more uniform wafer, avoiding problems of different gate capacitances for n-type FET and p-type FET. The use of a single patterning process simplifies fabrication and manufacture control.

The descriptions of the various embodiments of the present invention have been presented for purposes of illustration, but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A method of forming a fin-type field effect transistor (FinFET), the method comprising, in sequence:
    providing an assembly of a complementary pair of transistors in a fin configuration comprising a first transistor and a second transistor;
    conformally depositing a single spacer layer onto the assembly, wherein the single spacer layer comprises SiN, SiBCN or SiOCN;
    performing a reactive ion etch of the single spacer layer to define spacers over a gate region of both the first transistor and the second transistor such that a thickness of the spacer in the first transistor is equal to a thickness of the spacer in the second transistor;
selectively depositing an oxide over a location corresponding to a source region and a drain region of both the first transistor and the second transistor, wherein the oxide is present only on a semiconductor material at locations corresponding to the source and drain regions of both the first transistor and the second transistor;
placing a block mask over the first transistor;
removing the oxide at the locations corresponding to the source region and drain region of the second transistor;
performing an epitaxial growth of a doped semiconductor at the locations corresponding to the source and drain regions of the second transistor so as to form the source and drain regions self-aligned to the spacer; and
performing a selective nitridation on the doped semiconductor on the source and drain regions of the second transistor.

2. The method of claim 1 further comprising removing the block mask from over the first transistor prior to performing the epitaxial growth.

3. The method of claim 1 further comprising:
placing a block mask over the second transistor;
removing the oxide from the source region and drain region of the first transistor;
performing an epitaxial.

4. The method of claim 3 further comprising removing the block growth of a doped semiconductor on the source and drain regions of the first transistor; and
performing a selective nitridation on the doped semiconductor on the source and drain regions of the first transistor, and the block mask from over the second transistor prior to performing the epitaxial growth.

5. The method of claim 1 wherein:
performing the epitaxial growth comprises growing a source and drain region with an H-terminated silicon; and
performing the selective nitridation comprises placing a silicon nitride directly on the H-terminated silicon.

6. The method of claim 5 wherein:
placing the silicon nitride comprises using a process selected from the following: rapid thermal nitridation, furnace nitridation, remote plasma nitridation, and decoupled plasma nitridation.

7. The method of claim 5 wherein:
the selective nitride is configured to protect the source and drain regions without the use of a poly-open chemical mechanical process (POC) liner.

8. The method of claim 1 wherein:
the spacer for the first transistor has approximately equal dimensions as the spacer for the second transistor.

9. The method of claim 1 wherein:
performing an epitaxial growth on the source and drain regions of the second transistor is a self-aligned process.

10. A method of forming a fin-type field effect transistor (FinFET), the method comprising, in sequence:
providing an assembly of a complementary pair of transistors in a fin configuration comprising a first transistor and a second transistor;
conformally depositing a single spacer layer onto the assembly;
placing a block mask over the first transistor;
performing an etch of the single spacer layer over a gate region of the second transistor to define a spacer on sidewalls of the gate region to expose a semiconductor material corresponding to locations of a source and drain region of the second transistor;
removing the block mask from the first transistor;
performing a self-aligned epitaxial growth of the semiconductor material to the spacer to define the source and drain regions of the second transistor, wherein the semiconductor material is doped to form a doped semiconductor, and wherein the single spacer layer on the first transistor protects the source and drain regions therein; and
performing a selective nitridation on the doped semiconductor of the source and drain regions of the second transistor.

11. The method of claim 10 wherein the spacer over the first transistor prevents epitaxial growth from occurring on the first transistor.

12. The method of claim 10 further comprising:
placing a block mask over the second transistor;
performing an etch of a spacer over a gate region of the first transistor;
removing the block mask from the second transistor
performing an epitaxial growth of a doped semiconductor on the source and drain regions of the first transistor; and
performing a selective nitridation on the doped semiconductor on the source and drain regions of the first transistor.

13. The method of claim 12 wherein:
the spacer for the first transistor has approximately equal dimensions as the spacer for the second transistor.

14. The method of claim 10 wherein:
performing an epitaxial growth comprises growing a source and drain region with an H-terminated silicon; and
performing a selective nitridation comprises placing a silicon nitride directly on the H-terminated silicon.

15. The method of claim 14 wherein:
placing the silicon nitride comprises using a process selected from the following: rapid thermal nitridation, furnace nitridation, remote plasma nitridation, and decoupled plasma nitridation.

16. The method of claim 10 wherein:
performing an epitaxial growth on the source and drain regions of the second transistor is a self-aligned process.

17. A complementary pair of fin-type field effect transistors (FinFET), a first transistor and a second transistor, each transistor comprising:
at least one fin having an active region and a non-active region;
a channel region in the active region of the at least one fin;
a source region and a drain region in the active region of the at least one fin;
a gate region around the channel region, wherein the gate region controls a flow of current from the source region through the channel region into the channel region;
the transistors formed by:
providing an assembly of a complementary pair of transistors in a fin configuration comprising a first transistor and a second transistor;
conformally depositing a single spacer layer onto the assembly, wherein the single spacer layer comprises SiN, SiBCN or SiOCN;
performing a reactive ion etch of the single spacer layer to define spacers over the gate region of both the first transistor and the second transistor such that a thickness of the spacer in the first transistor is equal to a thickness of the spacer in the second transistor;

selectively depositing an oxide at locations corresponding to a the source region and the drain region of both the first transistor and the second transistor, wherein the oxide is present only at the locations corresponding to the source and drain regions of both the first transistor and the second transistor;

placing a block mask over the first transistor;

removing the oxide from the source region and drain region of the second transistor;

performing an epitaxial growth of a doped semiconductor at the locations corresponding to the source and drain regions of the second transistor so as to form the source and drain regions self-aligned to the spacers; and performing a selective nitridation on the doped semiconductor on the source and drain regions of the second transistor.

18. The complementary pair of FinFETs of claim 17 wherein forming the transistors further comprises:

placing a block mask over the second transistor;

removing the oxide from the source region and drain region of the first transistor;

performing an epitaxial growth of a doped semiconductor on the source and drain regions of the first transistor; and performing a selective nitridation on the doped semiconductor on the source and drain regions of the first transistor.

19. The complementary pair of FinFETs of claim 17 wherein:

performing the epitaxial growth comprises growing a source and drain region with an H-terminated silicon; and performing the selective nitridation comprises placing a silicon nitride directly on the H-terminated silicon.

20. The complementary pair of FinFETs of claim 19 wherein:

placing the silicon nitride comprises using a process selected from the following: rapid thermal nitridation, furnace nitridation, remote plasma nitridation, and decoupled plasma nitridation.

* * * * *